United States Patent
Tanabe et al.

(10) Patent No.: US 6,291,142 B1
(45) Date of Patent: *Sep. 18, 2001

(54) PHOTORESIST STRIPPING LIQUID COMPOSITIONS AND A METHOD OF STRIPPING PHOTORESISTS USING THE SAME

(75) Inventors: Masahito Tanabe; Kazumasa Wakiya; Masakazu Kobayashi; Toshimasa Nakayama, all of Kanagawa-ken (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/599,729

(22) Filed: Jun. 23, 2000

Related U.S. Application Data

(62) Division of application No. 09/173,005, filed on Oct. 15, 1998, now Pat. No. 6,225,034.

(30) Foreign Application Priority Data

Oct. 16, 1997 (JP) .................................................. 9-299500

(51) Int. Cl.$^7$ .............................. G03C 11/24; G03F 7/42; C11D 9/04
(52) U.S. Cl. ........................... 430/331; 430/329; 510/176
(58) Field of Search .................................... 430/331, 329; 510/176

(56) References Cited

U.S. PATENT DOCUMENTS

| | | |
|---|---|---|
| 5,279,771 | 1/1994 | Lee ........................... 252/548 |
| 5,334,332 | 8/1994 | Lee ........................... 252/548 |
| 5,381,807 | 1/1995 | Lee ............................. 134/2 |
| 5,417,877 | 5/1995 | Ward ......................... 510/176 |
| 5,482,566 | 1/1996 | Lee ........................... 134/42 |
| 5,496,491 | 3/1996 | Ward ......................... 510/176 |
| 5,556,482 | 9/1996 | Ward et al. ................. 134/38 |
| 5,672,577 | 9/1997 | Lee ........................... 510/175 |
| 5,707,947 | 1/1998 | Ward et al. ................ 510/176 |
| 5,753,601 | 5/1998 | Ward et al. ................ 510/176 |
| 5,795,702 | 8/1998 | Tanabe et al. ............. 430/331 |
| 5,798,323 * | 8/1998 | Honda et al. .............. 510/176 |

FOREIGN PATENT DOCUMENTS 6-266119   9/1994   (JP) .

OTHER PUBLICATIONS

Abstract of U.S. 5,494,532.
Unexamined Published Japanese Patent Application (Kokai) No. 96,911/1997 (disclosure date: Apr. 8, 1997), and an English abstract thereof.
Unexamined Published Japanese Patent Application (Kokai) No. 49,355/1987 (disclosure date: Mar. 4, 1987), and an English abstract thereof.

* cited by examiner

Primary Examiner—Richard L. Schilling
(74) Attorney, Agent, or Firm—Wenderoth, Lind & Ponack, L.L.P.

(57) ABSTRACT

The present invention relates to photoresist stripping liquid compositions comprising (a) 2–30 wt % of a hydroxylamine, (b) 2–35 wt % of water, (c) 25–40 wt % of at least one member selected from monoethanolamine and diethanolamine, (d) 20–32 wt % of dimethyl sulfoxide and (e) 2–20 wt % of an aromatic hydroxy compound and a method of stripping photoresists with the use of the same. The present invention provides photoresist stripping liquid compositions which are, even at higher treating temperatures, excellent in the capabilities of both stripping photoresist films and modified films and effective in prevention of the corrosion that would otherwise occur in substrates overlaid with Al or Al alloy layers or Ti layers, and a method for stripping photoresists by using the same.

3 Claims, No Drawings

PHOTORESIST STRIPPING LIQUID COMPOSITIONS AND A METHOD OF STRIPPING PHOTORESISTS USING THE SAME

This is a divisional of Ser. No. 09/173,005 filed Oct. 15, 1998, now U.S. Pat. No. 6,225,034.

BACKGROUND OF THE INVENTION

1. Field of the Invention

This invention relates to photoresist stripping liquid compositions and a method of stripping photoresists using the same. More particularly, the invention relates to photoresist stripping liquid compositions, having sufficiently good capabilities of stripping both photoresist films and modified films and inhibiting corrosion of substrates even at higher treating temperatures, to be suitably used in the fabrication of semiconductor devices such as ICs and LSIs or liquid-crystal panel devices. The invention also relates to a method of stripping photoresists using said liquid compositions.

2. Description of Relevant Art

Semiconductor devices such as ICs and LSIs as well as liquid-crystal panel devices are fabricated by a process comprising the following basic steps: forming a conductive metallic film such as a nesa film or an insulating film such as an $SiO_2$ film onto a substrate by chemical vapor deposition or any other suitable techniques; applying a uniform photoresist layer over the metallic or insulating film; exposing the applied photoresist layer to light and developing the exposed layer to form a photoresist pattern; selectively etching the conductive metallic film or the insulating film through the photoresist pattern as a mask pattern to form a fineline circuit and stripping away the unwanted photoresist layer with a liquid stripper. Other examples of the metallic film include those made of aluminum (Al), an aluminum alloy (Al alloy) such as aluminum-silicon (Al—Si) or aluminum-silicon-copper (Al—Si—Cu); pure titanium (Ti); or a titanium alloy (Ti alloy) such as titanium nitride (TiN) or a titanium-tungsten system (TiW). One or more of such metallic films are formed onto the substrate.

While various liquid compositions have heretofore been used to strip photoresist layers, the use of liquid systems incorporating alkanolamines was recently proposed (as in Unexamined Published Japanese Patent Applications Nos. 49,355/1987 and 208,043/1988).

In the current fabrication process of semiconductor devices and liquid-crystal devices, dry etching, ashing, ion implantation and other post-treatments are applied to photoresist films, and that it becomes necessary to strip thusly treated photoresist films. Due to those post-treatments, the photoresist films become modified in nature. With the recent increase in the strictness of the conditions for these post-treatments, the nature of the modified photoresist films tends to become inorganic than organic and, as a result, the liquid strippers using alkanolamines have turned out to be inadequate for the purpose of stripping the modified photoresist films.

More recently, liquid compositions containing hydroxylamines have been proposed as systems capable of more efficient stripping of modified photoresist films. For example, Unexamined Published Japanese Patent Application No. 289,866/1992 describes a photoresist stripping liquid composition containing both hydroxylamines and alkanolamines, and Unexamined Published Japanese Patent Application No. 266,119/1994 describes a photoresist stripping liquid composition containing not only hydroxylamines and alkanolamines but also a chelating agent (corrosion inhibitor) such as catechol.

These liquid compositions containing hydroxylamines have a greater ability to strip the modified photoresist films than the liquid strippers containing alkanolamines. However, they cause another problem in that substrates having deposited films of Al or Al alloys such as Al—Si and Al—Si—Cu, or pure titanium (Ti) are corroded. In fact, the stripping liquid composition described in Unexamined Published Japanese Patent Application No. 266,119/1994 is capable of preventing the corrosion of titanium alloys but not of pure titanium (Ti), which will suffer from progressive corrosion.

To avoid these problems, several proposals have been made as exemplified by the teaching of Unexamined Published Japanese Patent Application No. 96,911/1997, which discloses photoresist stripping liquid compositions comprising hydroxylamines, water, amines having a specific acid dissociation constant, water-soluble organic solvents and a specified amount of corrosion inhibitors. These compositions are excellent particularly in the capability of stripping modified films and exert good corrosion-inhibiting effects on substrates having films of Al, Al alloys or pure titanium (Ti) formed thereon, however, are still insufficient in the capability of stripping photoresist films.

And furthermore, in recent years, it has been required to perform the stripping at higher temperatures so as to elevate the performance efficiency. With an increase in the treating temperatures, stripping capability would be improved in general, while metallic films formed on substrates are corroded more seriously. Moreover, it has been urgently required to develop stripping liquid compositions usable in stripping both photoresist films and modified films at higher treating temperatures.

Under these circumstances, it has been desired to develop liquid photoresist strippers capable of, even at higher treatment temperatures, not only efficient strippability of both photoresist films and modified films but also effective prevention of the corrosion of substrates having metallic films, in particular those of Al or Al alloys or Ti formed thereon.

The present inventors conducted intensive studies with a view to meeting this need. As a result, they found that the need could be satisfied by using photoresist stripping liquid compositions which contain hydroxylamines, water, specified amines, dimethyl sulfoxide and aromatic hydroxy compounds in specified proportions. The present invention has been accomplished on the basis of this finding.

SUMMARY OF THE INVENTION

An object, therefore, of the present invention is to provide photoresist stripping liquid compositions capable of, at higher treating temperatures, not only efficient strippability of both of photoresist films and modified films but also effective prevention of the corrosion of substrates having metallic films, formed thereon, in particular those of Al or Al alloys or pure titanium (Ti).

Another object of the invention is to provide a method of stripping photoresists using said liquid compositions.

The first object of the present invention can be attained by a photoresist stripping liquid composition comprising: (a) 2–30 wt % of a hydroxylamine; (b) 2–35 wt % of water; (c) 25–40 wt % of at least one member selected from monoethanolamine and diethanolamine; (d) 20–32 wt % of dimethyl sulfoxide; and (e) 2–20 wt % of an aromatic hydroxy compound.

The second object of the present invention can be attained by a method of stripping photoresists comprising the steps of: (i) forming a photoresist layer over a substrate having metallic layer(s) thereon; (ii) selectively exposing the applied photoresist layer to light through a mask pattern; (iii) developing said exposed photoresist layer to provide a photoresist pattern; (iv) etching the substrate through said photoresist pattern as a mask pattern; (v) further, if desired, ashing said photoresist pattern after step (iv); and (vi) stripping away the photoresist pattern or the ashed photoresist pattern from the substrate, characterized in that the (ashed) photoresist pattern is stripped away from the substrate after the etching or ashing with above-mentioned photoresist stripping liquid composition at a temperature of 75–85° C.

DETAILED DESCRIPTION OF THE INVENTION

The term "Ti(titanium)" as used herein means "pure titanium" and shall not include titanium alloys such as titanium nitride (TiN) and the titanium tungsten system (TiW).

The hydroxylamine used as component (a) of the liquid stripper according to the first aspect of the present invention is represented by the following general formula (I):

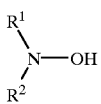

wherein $R^1$ and $R^2$ each independently represents a hydrogen atom or a lower alkyl group having 1–6 carbon atoms.

The lower alkyl group having 1–6 carbon atoms may be exemplified by methyl, ethyl, propyl, isopropyl, butyl, isobutyl, sec-butyl, tert-butyl, pentyl, isopentyl, neopentyl, tert-pentyl, hexyl, isohexyl, 3-methylpentyl, 2,2-dimethylbutyl and 2,3-dimethylbutyl. In the formula (I), $R^1$ and $R^2$ may be the same as or different from each other.

Specific examples of the hydroxylamine as component (a) include hydroxylamine($NH_2OH$), N-methylhydroxylamine, N,N-dimethylhydroxylamine and N,N-diethylhydroxylamine, among which hydroxylamine ($NH_2OH$) is preferred. These hydroxylamines may be used either independently or in combination with themselves.

Water as component (b) is an inevitable part of component (a) but it may be intentionally added to adjust the water content to a desired level.

Component (c) may be one or more member selected from monoethanolamine and diethanolamine.

As component (d), dimethyl sulfoxide is used.

The aromatic hydroxy compound as component (e) is employed mainly for achieving an anti-corrosion effect. Particular examples thereof include phenol, cresol, xylenol, pyrocatechol (i.e., 1,2-dihydroxybenzene), tert-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, -hydroxybenzoic acid, 2,4-dihydroxybenzoic acid, 2,5-dihydroxybenzoic acid, 3, 4-dihydroxybenzoic acid and 3,5-dihydroxybenzoic acid. Among these, pyrocatechol and tert-butylcatechol are preferred. These compounds may be used either independently or in combination with themselves.

Components (a)–(e) are incorporated in the following proportions: 2–30 wt %, preferably 5–20 wt %, of component (a); 2–35 wt %, preferably 5–25 wt %, of component (b); 25–40 wt %, preferably 30–35 wt %, of component (c); 20–32 wt %, preferably 25–30 wt %, of component (d); and 2–20 wt %, preferably 3–10 wt %, of component (e). The relative pro–portions of components (a)–(e) are critical to achieve the purposes of the present invention. By regulating the content of each component within the scope as specified above, both photoresist films and modified films can be efficiently stripped away while metallic films are not corroded even at higher treating temperatures of 75–85° C. When the content of component (c) exceeds 40 wt %, substrates having Al or Al alloy layers formed thereon are corroded, although the capabilities of both of stripping photoresist films and modified films are improved. When the content of component (c) is less than 25 wt %, substrates having Ti layers formed thereon are corroded.

The photoresist stripping liquid composition of the present invention can advantageously be used with both negative- and positive-working photoresists that are developable with aqueous alkali solutions. Applicable photoresists include but are not limited to: (i) positive-working photoresists containing naphthoquinone diazide compounds and novolac resins; (ii) positive-working photoresists containing compounds that generate acids upon exposure to light, compounds that are decomposed with acids to become more soluble in aqueous alkali solutions, and alkali-soluble resins; (iii) positive-working photoresists containing compounds that generate acids upon exposure to light and alkali-soluble resins containing groups that are decomposed with acids to become more soluble in aqueous alkali solutions; and (iv) negative-working photoresists containing compounds that generate acids upon exposure to light, crosslinking agents and alkali-soluble resins.

The method of stripping photoresists according to the second aspect of the present invention comprising the following steps is classified into the following two cases, namely, one comprising forming a photoresist pattern over a substrate by lithography, etching the substrate and then stripping away the photoresist film; and another comprising, forming a photoresist pattern over a substrate by lithography, etching the substrate, ashing the photoresist pattern and then stripping away the thusly formed ashed photoresist pattern, i.e., a modified film or residue.

The former where the non-ashed photoresist pattern is stripped away from the substrate is exemplified by a process comprising the following steps:

(I) forming a photoresist layer by applying a photoresist composition over a substrate having metallic layer(s) thereon and drying it;

(II) selectively exposing the photoresist layer to light through a mask pattern;

(III) developing the light-exposed photoresist layer to provide a photoresist pattern;

(IV) etching the substrate through the photoresist pattern as a mask pattern; and (V) stripping away the photoresist pattern from the substrate;

characterized in that the photoresist pattern is stripped with the photoresist stripping liquid composition of the present invention at a temperature of 75–85° C.

The latter where the modified film (i.e., ashed photoresist pattern, residue) is stripped away from the substrate is exemplified by a process comprising of the following steps:

(I) forming a photoresist layer by applying a photoresist composition over a substrate having metallic layer(s) thereon and drying it;

(II) selectively exposing the photoresist layer to light through a mask pattern;

(III) developing the light-exposed photoresist layer to provide a photoresist pattern;

(IV) etching the substrate through the photoresist pattern as a mask pattern;

(V) ashing the photoresist pattern; and (VI) stripping away the thus ashed photoresist pattern from the substrate;

characterized in that the ashed photoresist pattern is stripped with the photoresist stripping liquid composition of the present invention at a temperature of 75–85° C.

The substrate having metallic layer(s) formed thereon is exemplified by those having metallic films of aluminum (Al); an aluminum alloy (Al alloy) such as aluminum—silicon (Al—Si) or aluminum—silicon—copper (Al—Si—Cu); pure titanium (Ti); or a titanium alloy (Ti alloy) such as titanium nitride (TiN) or a titanium—tungsten system (TiW) formed thereon. The strip—ping method of the present invention is extremely effective in inhibiting the corrosion of, in particular, a pure titanium—(Ti) layer formed over a substrate successively, having at least the pure titanium (Ti) layer as the metallic layer, for example, one having a titanium nitride (TiN) layer as the first layer, a pure titanium (Ti) layer formed thereon as the second layer, an Al—Si—Cu layer formed thereon as the third layer and an additional TiN layer formed thereon as the fourth layer.

The application, drying, exposure to light, etching and ashing are the operations commonly employed in the art and not particularly restricted. The etching may be performed either by wet etching, dry etching or a combination thereof. Although the ashing is an operation inherently carried out for stripping photoresist patterns, it is frequently observed that some parts of those photoresist patterns remain as modified films after the ashing. The present invention is effective for completely stripping away the modified films in these cases.

After the above-mentioned development step (III) or the stripping step (V) or (VI), rinsing with pure water, lower alcohols, etc., and drying may be carried out, as conventionally done in the art.

Moreover, some photoresists may be heated after the completion of the exposure to light as the post-exposure baking usually employed in the case of chemically amplified photoresists. It is also possible to effect post-baking after the formation of the photoresist pattern.

The stripping may be usually performed by immersion or spraying. In this step, the stripping liquid is usually maintained at 50–85° C. In the stripping method of the present invention, however, a high anti-corrosion effect on metallic films and excellent capabilities of both stripping photoresist films and modified films can be achieved even at higher treating temperatures of 75–85° C. The stripping procedure may be continued for a sufficient period of time without restriction. In usual, it takes about 10–20 minutes.

The following examples are provided for the purpose of further illustrating the present invention but are by no means intended to limit the same.

EXAMPLES 1–5 AND COMPARATIVE EXAMPLES 1–5

A silicon wafer (substrate) having successively a TiN layer as the first layer, a pure titanium (Ti) layer as the second layer, an Al—Si—Cu layer as the third layer and a TiN layer as the fourth layer was spin coated with THMR-iP3300 (product of Tokyo Ohka Kogyo Co., Ltd.) which was a positive-working photoresist comprising a naphthoquinone diazide compound and a novolac resin. The applied coating was prebaked at 90° C. for 90 sec to form a photoresist layer in a thickness of 2.0 µm. The photoresist layer was exposed to light through a mask pattern using NSR-2005i10D (product of Nikon Corp.) and subsequently developed with an aqueous solution of 2.38 wt % tetramethylammonium hydroxide (TMAH) to form a photoresist pattern which was then post-baked at 120° C. for 90 sec.

[Test on Photoresist Film Strippability]

The silicon wafer having the thus formed photoresist pattern was dry etched. It was then immersed in each liquid stripper of the composition (see Table 1 for its composition) at 80° C. for 20 min so as to strip the photoresist film. After the stripping treatment, the substrate was sufficiently rinsed with pure water. Then the photoresist film strippability and the states of corrosion in the first to fourth layers were evaluated by photographing under an SEM (scanning electron microscope). Table 1 shows the results wherein no data on the first and fourth layers of TiN are provided since these layers suffered from no corrosion.

[Test on Modified Film Strippability]

A photoresist pattern was formed and a silicon wafer was etched each in the same manner as the corresponding one described above.

Then, the photoresist pattern was subjected to plasma-assisted ashing with oxygen gas at 150° C. for 60 sec by using an ashing device "TCA-3822" (product of Tokyo Ohka Kogyo Co., Ltd.), yielding the residue (a modified film) from the ashing operation.

Then the thus processed silicon wafer was immersed in each liquid stripper of the composition (see Table 1 for its composition) at 80° C. for 20 min so as to strip the modified film. The substrate was then sufficiently rinsed with pure water, and the modified film strippability and the states of corrosion in the first to fourth metallic film layers were evaluated by photographing under an SEM (scanning electron microscope). Table 1 shows the results wherein no data on the first and fourth layers of TiN are provided since these layers suffered from no corrosion.

The criteria for evaluation of the strippability of the photoresist and modified films were as follows:

⊚: good strippability;

○: showing some residue;

Δ: showing much residue.

The criteria for evaluation of the corrosion state were as follows:

⊚: scarcely any corrosion;

○: slight corrosion;

Δ: considerable corrosion.

As the data given in the Table 1 below show, the photoresist stripping liquid compositions of Examples 1–5 were excellent in the capabilities of stripping both of photoresist films and modified films and in the effect of inhibiting the corrosion of substrates. Among all, these effects were achieved in the most desirable manner by using the photoresist stripping liquid composition of Example 3.

TABLE 1

| No. | Composition of Liquid Photoresist Stripper (wt %) | | | | | Strippability photo-Resist film | Strippability Modified film | State of corrosion Al—Si—Cu | State of corrosion Ti |
| --- | --- | --- | --- | --- | --- | --- | --- | --- | --- |
| | (a) | (b) | (c) | (d) | (e) | | | | |
| Ex. 1 | HA (15) | water (20) | monoethanol-amine (30) | DMSO (30) | t-b-catechol (5) | ◎ | ◎ | ◎ | ◎ |
| Ex. 2 | HA (15) | water (20) | diethanol-amine (35) | DMSO (25) | t-b-catechol (5) | ◎ | ◎ | ◎ | ◎ |
| Ex. 3 | HA (15) | water (15) | monoethanol-amine (30) | DMSO (30) | pyrocatechol (10) | ◎ | ◎ | ◎ | ◎ |
| Ex. 4 | HA (15) | water (15) | diethanol-amine (35) | DMSO (25) | pyrocatechol (10) | ◎ | ◎ | ◎ | ◎ |
| Ex. 5 | HA (15) | water (15) | monoethanol-amine (25) + diethanol-amine (10) | DMSO (25) | pyrocatechol (10) | ◎ | ◎ | ◎ | ◎ |
| Comp. Ex. 1 | HA (15) | water (15) | monethanol-amine (10) | DMSO (55) | pyrocatechol (5) | ◎ | ◎ | ◎ | ○ |
| Comp. Ex. 2 | HA (20) | water (20) | diethylene-triamine (10) | DMSO (40) | pyrocatechol (10) | Δ | ◎ | ◎ | ◎ |
| Comp. Ex. 3 | HA (15) | water (20) | triethylene-tetramine (10) | DMSO (45) | pyrocatechol (10) | Δ | ◎ | ◎ | ◎ |
| Comp. Ex. 4 | HA (17.5) | water (17.5) | 2-(2-amino-ethoxy)ethanol (27) | DMSO (33) | pyrocatechol (5) | ◎ | ◎ | Δ | ○ |
| Comp. Ex. 5 | HA (15) | water (20) | monoethanol-amine (50) | DMSO (10) | pyrocatechol (5) | ◎ | ◎ | ○ | ◎ |

Note:
HA: hydroxylamine;
DMSO: dimethyl sulfoxide;
t-b-catechol: tert-butylcatechol As described above in detail, the present invention has achieved the effects of providing photoresist stripping liquid compositions which are, even at higher treating temperatures, excellent in the capabilities of both stripping photoresist films and modified films that have been formed by dry etching, ashing, ion implantation and other treatments under hostile conditions, and are effective in prevention of the corrosion that would otherwise occur in substrates overlaid with Al or Al alloy layers or Ti layers. This invention also provides a method for stripping photoresists using the improved liquid compositions above.

What is claimed is:

1. A photoresist stripping liquid composition comprising (a) 2–30 wt % of a hydroxylamine, (b) 2–35 wt % of water, (c) 25–40 wt % of at least one member selected from monoethanolamine and diethanolamine, (d) 20–32 wt % of dimethyl sulfoxide and (e) 2–20 wt % of an aromatic hydroxy compound.

2. A composition according to claim 1, wherein said component (a) is hydroxylamine ($NH_2OH$).

3. A composition according to claim 1, wherein said component (e) is at least one member selected from pyrocatechol and tert-butylcatechol.

* * * * *